US007183873B1

(12) United States Patent
Schwendinger et al.

(10) Patent No.: US 7,183,873 B1
(45) Date of Patent: Feb. 27, 2007

(54) TAPERED THICKNESS BROADBAND MATCHING TRANSFORMER

(75) Inventors: Eric J. Schwendinger, Monticello, IA (US); Don L. Landt, Palo, IA (US); Allen W. Jones, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 79 days.

(21) Appl. No.: 10/953,225

(22) Filed: Sep. 29, 2004

(51) Int. Cl.
*H03H 7/38* (2006.01)

(52) U.S. Cl. .......................................... 333/34; 333/35

(58) Field of Classification Search .................. 333/34, 333/33, 35
See application file for complete search history.

(56) References Cited

U.S. PATENT DOCUMENTS

| | | | | |
|---|---|---|---|---|
| 3,634,789 | A * | 1/1972 | Stuckert | 333/81 A |
| 4,472,690 | A * | 9/1984 | Hallford | 333/35 |
| 2002/0025439 | A1 * | 2/2002 | Ueda et al. | 428/428 |
| 2004/0012458 | A1 * | 1/2004 | Amparan et al. | 333/34 |

* cited by examiner

*Primary Examiner*—Stephen E. Jones
(74) *Attorney, Agent, or Firm*—Nathan O. Jensen; Kyle Eppele

(57) ABSTRACT

An impedance matching transformer is disclosed. The transformer includes a conductive ground plane and a dielectric substrate disposed upon the conductive ground plane. The dielectric substrate has a first end and a second end. The dielectric substrate may be of a unitary construction. A conductive current path is disposed upon the dielectric substrate. The height of the dielectric substrate at the second end is greater than the height of the dielectric substrate at the first end.

7 Claims, 3 Drawing Sheets

TAPERED THICKNESS BROADBAND MATCHING TRANSFORMER

FIELD OF THE INVENTION

The invention relates to transformers, and more particularly, to a transformer capable of impedance matching over a wide range of frequencies.

BACKGROUND OF THE INVENTION

Power amplifiers typically have been designed to operate within limited or narrow frequency bands because of technical challenges associated with broadband amplifier design. If it is desired to communicate within a large number of frequency bands, a correspondingly large number of product lines, each designed for one of the frequency bands, must therefore be offered. The large number of product lines for the different frequency bands increases the design, manufacture and inventory cost, along with the size, weight and complexity of the associated electronic components.

There have been recent efforts to develop broadband power amplifiers which would be useful in broadband communications systems such as the Joint Tactical Radio System (JTRS). To accommodate this increased bandwidth, which may for example range from 200 MHz to 2000 MHz, the matching networks within the amplifier circuitry must be designed to minimize insertion loss and maximize return loss over the wider frequency band. This may require additional electrical components because of a lower matching network quality factor, and the additional components may cause the structure size to increase, which may result in prohibitively large amplifier structures.

One of the components in an amplifier structure is a transformer placed between a power amplifier and other electronic components. The impedance of an amplifier output signal may be on the order of 1 ohm, yet must be matched to an impedance load of 50 ohms when the amplifier output is processed by other electronic components. Known transformers intended for use with broadband communication systems are prohibitively large and cannot reasonably be used in portable communications systems.

It is therefore an object of the invention to reduce the physical size of a broadband power amplifier structure.

It is also an object of the invention to reduce the physical size of a transformer used in a broadband power amplifier.

A feature of the invention is a transformer having a substrate with a variable height.

An advantage of the invention is a reduction in size of a broadband transformer.

SUMMARY OF THE INVENTION

The invention provides an impedance matching transformer including a conductive ground plane and a dielectric substrate disposed upon the conductive ground plane. The dielectric substrate has a first end and a second end. The dielectric substrate may be of a unitary construction. A conductive current path is disposed upon the dielectric substrate. The height of the dielectric substrate at the second end is greater than the height of the dielectric substrate at the first end.

The invention also provides a method of transforming impedance from a first impedance level to a second, higher impedance level. According to the method, a dielectric substrate is disposed upon a conductive ground plane. The dielectric substrate has a first end and a second end. The dielectric substrate is of a unitary construction that increases in height between the first end and the second end. A conductive current path is provided that is operationally connected to the dielectric substrate.

The invention further provides an impedance matching transformer. The transformer includes means for providing a conductive ground plane and means for conducting a current. The transformer also includes means for providing a dielectric effect between the means for providing the conductive ground plane and the means for conducting the current. The means for providing a dielectric effect is of unitary construction and has first and second ends. The means for providing a dielectric effect has a height that increases between said first and second ends.

DETAILED DESCRIPTION OF THE DRAWINGS

Figure 1:
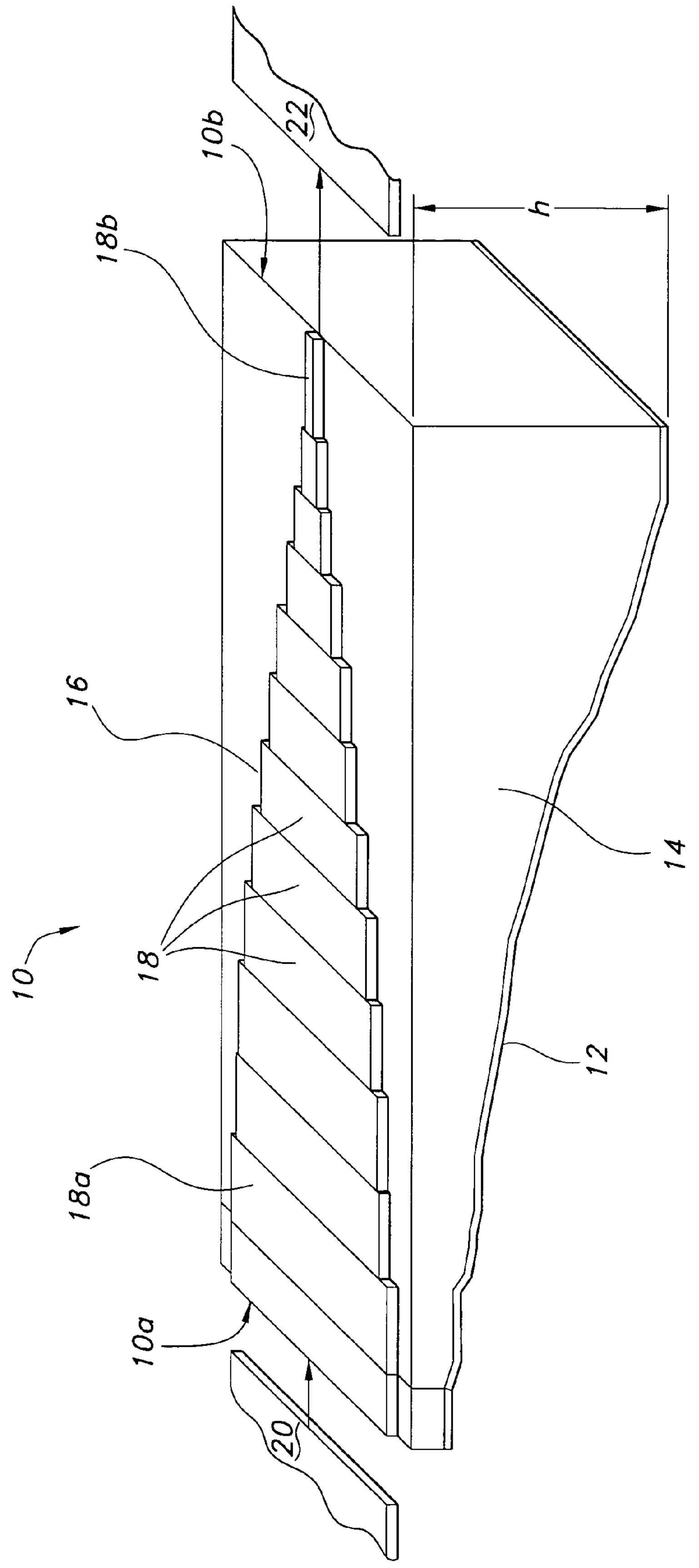
FIG. 1 is a perspective view of a transformer according to the invention.

A tapered thickness broadband matching transformer according to the invention is depicted in FIG. 1 and indicated generally by reference number 10. Transformer 10 has a low impedance input end 10*a* and a high impedance output end 10*b*. Transformer 10 includes a conductive ground plane 12, and preferably is a metalized ground plane. The transformer also includes a dielectric substrate 14. The dielectric substrate is made of a material having suitable dielectric properties, such as a ceramic material. Transformer 10 further includes a conductive section 16, which in FIG. 1 is configured to act as a quarter-wave transformer (QWT). The conductive section includes a plurality of microstrip sections 18 that may vary in width between input end 10*a* to output end 10*b*. The microstrip section 18*a* adjacent input end 10*a* is connected to a low impedance input from an amplifier 20, and the microstrip section 18*b* adjacent output end 10*b* is connected to a high impedance output that may be directed to other electronic components 22. The characteristic impedance of microstrip sections 18 are designed to increase from the low impedance input (for example, about one ohm) to the high impedance output (for example, about 50 ohms) so that insertion loss is minimized and return loss is maximized over the frequency of interest.

To minimize the size of the transformer, dielectric substrate 14 is made of a material having a dielectric constant higher than what is typically used in transformers. Whereas known transformers use dielectric substrates having a dielectric constant in the range of 2 to 10, the dielectric substrate used with the invention has a dielectric constant of about 35 or above. Specifically, a dielectric constant between 39 and 100 has been found to be suitable for the invention. Increasing the dielectric constant equates to a shorter wavelength in the dielectric, and this reduces the required length and width of microstrip sections 18. However, reducing by too much the dimensions of the microstrip sections results in unacceptably high levels of conductor loss, dielectric loss, thermal dissipation, and current density—especially at the higher impedances near output end 10*b*.

To counteract the undesirable effects of reducing the dimensions of microstrip sections 18, dielectric substrate 14 is configured to increase in height h between input end 10*a* and output end 10*b*, and specifically, to increase the height of the dielectric substrate adjacent or underneath the microstrip sections with excessively small dimensions. As shown in FIG. 1, dielectric substrate has a relatively small height adjacent microstrip section 18*a*, and increases in height in a stepped fashion to a maximum height adjacent microstrip section 18*b*. (It should be noted that the dimensions of the dielectric substrates and the microstrip sections as drawn herein are not necessarily to scale.) Increasing the substrate height permits the dimensions of the respective microstrip section to be increased while maintaining the same characteristic impedance. Because increasing the substrate height does not affect the wavelength in the dielectric, the length of the matching structure is not impacted by variations in dielectric height.

Figure 4:
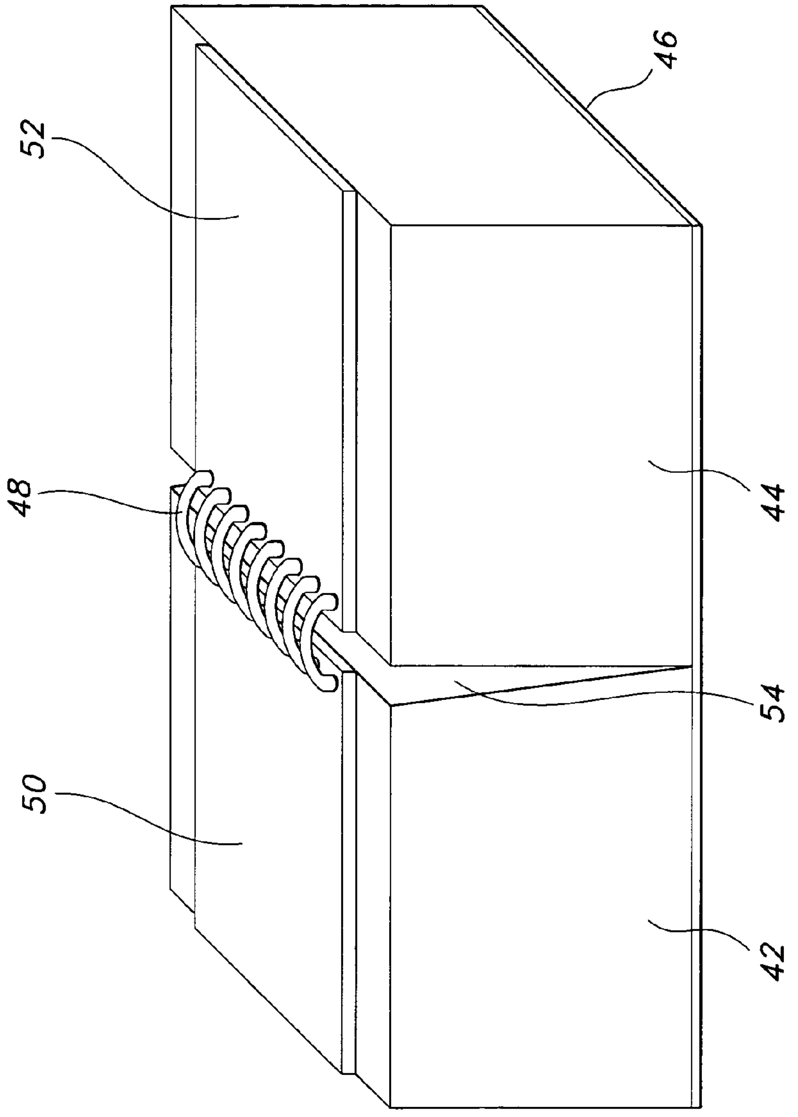
FIG. 4 is a perspective view of a transformer having more than one dielectric substrate.

Increasing dielectric constant and the substrate height significantly reduces the size of transformer 10 when compared to known transformers with similar performance parameters. A benefit of this size reduction is that dielectric substrate 14 may be formed from a single, contiguous piece of dielectric material instead of multiple dielectric elements that are characteristic of large transformer structures. A section of such a transformer is shown in FIG. 4, where a first substrate 42 and a second substrate 44 are placed upon a conductive ground plane 46. A plurality of bond wires 48 connect metalized traces 50, 52 that are disposed upon first and second substrates 42, 44 respectively. Multiple dielectric portions are used because of the smaller expense and the reduction in thermal expansion issues associated with a single, monolithic dielectric section. However, if the first and/or second substrate is not perfectly cut, an air gap 54 will be created therebetween, and parasitic losses will likely result. Furthermore, the use of bond wires 48 create the potential for parasitic losses. Lastly, discontinuities between the substrates and conductive ground plane 46 may also create parasitic losses. All of these parasitic losses are eliminated by the single, compact dielectric substrate of the invention. Furthermore, since no bond wires are necessary to connect metalized traces 50, 52, it is much more practical and efficient to manufacture a transformer using microstrip transmission line as with the disclosed invention.

Figure 2:
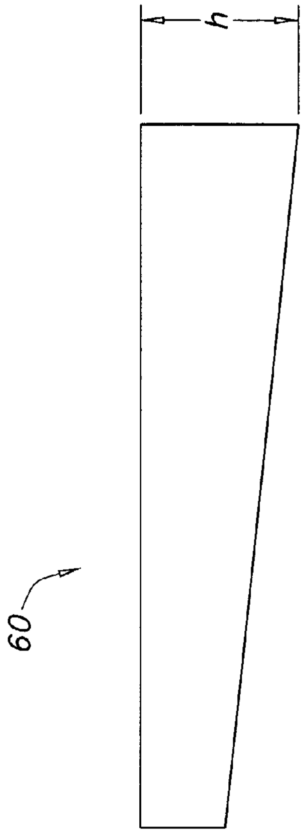
FIG. 2 is a side elevational view of a dielectric substrate according to the invention.
Figure 3:
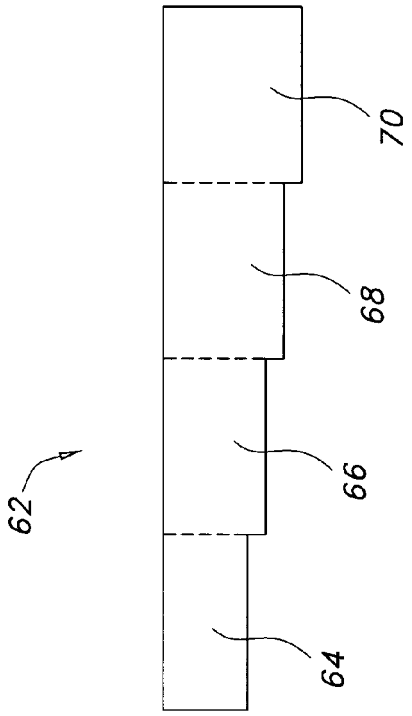
FIG. 3 is a side elevational view of a dielectric substrate according to the invention.

The invention may be modified in many ways while keeping within the spirit of the invention. For example, Dielectric substrate 14 is shown in FIG. 1 as having stepped increases in height; however, it may be advantageous to continuously increase the height of the dielectric substrate. FIG. 2 shows a dielectric substrate 60 having a continuously increasing height h. Also, a dielectric substrate with a variable dielectric constant may be used. FIG. 3 shows a dielectric substrate 62 with stepped increases in height. Dielectric substrate 62 is made of a thermoplastic material that is doped with a dielectric material. Each section 64, 66, 68, 70 of dielectric substrate 62 is doped at a different rate to provide different dielectric constants for each of the respective sections. For example, section 64 may have a dielectric coefficient of 80 or higher, while section 70 may have a dielectric coefficient of about 10. Sections 66 and 68 may therefore have dielectric coefficients somewhere between 80 and 10.

The impedance provided at a given location along the transformer depends in part upon the height h and the dielectric constant of the dielectric at that location as well as the width of the microstrip section 18 at said location. Therefore, for a desired impedance, the width of each of the microstrip sections 18 will vary depending in part upon the height and dielectric constant of the dielectric substrate directly below each section. This means that the microstrip sections may not gradually decrease in width between input and output ends 10*a*, 10*b* as depicted in FIG. 1; in fact, the width of the microstrip sections 18 may actually increase between the input and output ends as the height and/or the dielectric constant of the dielectric substrate directly below the microstrip section increases.

Although the invented transformer has been described as being used with a broadband power amplifier, the transformer may also be used with other electronic components where a low-to-high impedance match is required, such as antennas, filters, and other loads or components.

The concepts discussed herein may be used with other types of transformer structures, such as stripline exponential taper transformers, stub transformers, binomial transformers, chebyshev transformers, chebyshev taper transformers, coplanar quarter-wave transformer, and the like.

The invention as described herein provides a broadband matching transformer advantageously useable for impedance matching with a power amplifier or the like. An advantage of the invention is that the size of the transformer is significantly reduced when compared to transformers having similar output characteristics. A change in dielectric constant from 2.45 to 74 can provide a reduction in transformer length of 5:1 using the concepts of this invention. A reduction in transformer length of up to 80% is possible using the concepts of the invention.

Another advantage is that a single, relatively small dielectric substrate is less costly to manufacture and is less susceptible to breakage and thermal stresses.

Because multiple dielectric substrates are not needed, another advantage of the invention is that the inherent parasitic losses from (a) bond wires between conductive traces, (b) air gaps between adjacent dielectric substrates, and (c) ground plane discontinuities, are eliminated.

Yet another advantage is that increasing or varying the dielectric constant and varying the height of the dielectric substrate establishes independent control of trace width and transformer length during the transformer design process.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. An impedance matching transformer, comprising:

a conductive ground plane;

a dielectric substrate disposed upon the conductive ground plane and having a first end and a second end, the first end being associated with a first impedance level and the second end being associated with a second, higher impedance level, wherein the dielectric substrate is of a unitary construction; and a conductive current path, disposed upon the dielectric substrate;

wherein a height of the dielectric substrate at the second end is greater than a height of the dielectric substrate at the first end.

2. The transformer of claim 1, wherein the dielectric substrate has a first dielectric coefficient adjacent the first end and a second dielectric coefficient adjacent the second end, and further wherein the first dielectric coefficient is greater than the second dielectric coefficient.

3. The transformer of claim 1, wherein the dielectric substrate steadily increases in height between the first end and the second end of the dielectric substrate.

4. The transformer of claim 1, wherein the conductive current path is configured to create a microstrip quarter-wave transformer.

5. The transformer of claim 1, wherein the conductive current path decreases in width between the first end and the second end.

6. The transformer of claim 1, wherein the dielectric substrate has at least two sections of constant height.

7. The transformer of claim 6, wherein the dielectric substrate has a dielectric constant in the range of about 35 to 100.

* * * * *